(12) United States Patent
Tanaka

(10) Patent No.: US 11,777,027 B2
(45) Date of Patent: Oct. 3, 2023

(54) SEMICONDUCTOR DEVICE

(71) Applicants: SANKEN ELECTRIC CO., LTD., Niiza (JP); Allegro MicroSystems, LLC, Manchester, NH (US)

(72) Inventor: Bungo Tanaka, Niiza (JP)

(73) Assignees: SANKEN ELECTRIC CO., LTD., Niiza (JP); Allegro MicroSystems, LLC, Manchester, NH (US)

( * ) Notice: Subject to any disclaimer, the term of this patent is extended or adjusted under 35 U.S.C. 154(b) by 37 days.

(21) Appl. No.: 17/361,406

(22) Filed: Jun. 29, 2021

(65) Prior Publication Data
US 2022/0416078 A1    Dec. 29, 2022

(51) Int. Cl.
*H01L 29/78* (2006.01)
*H01L 29/40* (2006.01)

(52) U.S. Cl.
CPC ........ *H01L 29/7813* (2013.01); *H01L 29/407* (2013.01)

(58) Field of Classification Search
CPC .......................... H01L 29/7813; H01L 29/407
USPC ...................................................... 257/330
See application file for complete search history.

(56) References Cited

U.S. PATENT DOCUMENTS

| | | | |
|---|---|---|---|
| 9,818,828 B2 | 11/2017 | West et al. | |
| 9,899,343 B2 | 2/2018 | West et al. | |
| 11,456,379 B1* | 9/2022 | Chuang | H01L 29/407 |
| 2008/0042172 A1* | 2/2008 | Hirler | H01L 29/66734 |
| | | | 257/E29.338 |
| 2009/0152624 A1 | 6/2009 | Hiller et al. | |
| 2014/0374871 A1* | 12/2014 | Hirabayashi | H01L 29/66348 |
| | | | 257/488 |
| 2020/0212218 A1* | 7/2020 | Kim | H01L 29/1095 |
| 2020/0227537 A1* | 7/2020 | Li | H01L 29/7811 |
| 2022/0223729 A1* | 7/2022 | Kondo | H01L 29/7813 |

* cited by examiner

*Primary Examiner* — Igwe U Anya
(74) *Attorney, Agent, or Firm* — METROLEX IP LAW GROUP, PLLC

(57) ABSTRACT

A first semiconductor region, a second semiconductor region, and a third semiconductor region are arranged in layers. Trenches penetrate through the second semiconductor region and reach the first semiconductor region. Each of the trenches may include a gate electrode, and an insulating film insulating the gate electrode from the first semiconductor region and the second semiconductor region. An upper electrode is electrically connected to the second semiconductor region and the third semiconductor region. A fourth semiconductor region of the second conductivity type is arranged on an outer side of the trench of which the gate electrode is an outermost gate electrode in a plan view. An edge trench is arranged on an outer side of the fourth semiconductor region. The fourth semiconductor region is electrically connected to the upper electrode and a bottom of the fourth semiconductor may be arranged deeper than a bottom of the second semiconductor region.

20 Claims, 5 Drawing Sheets

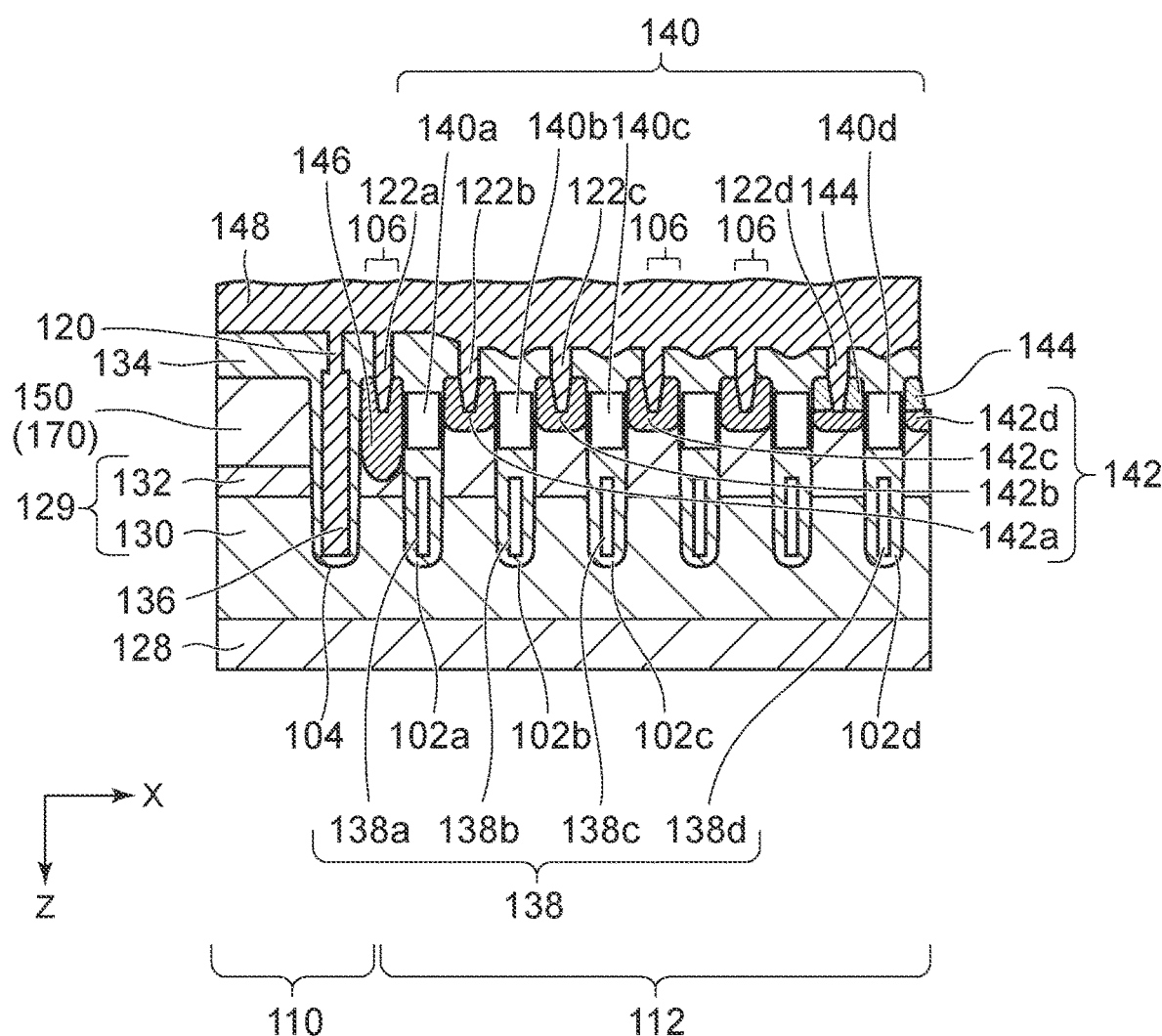

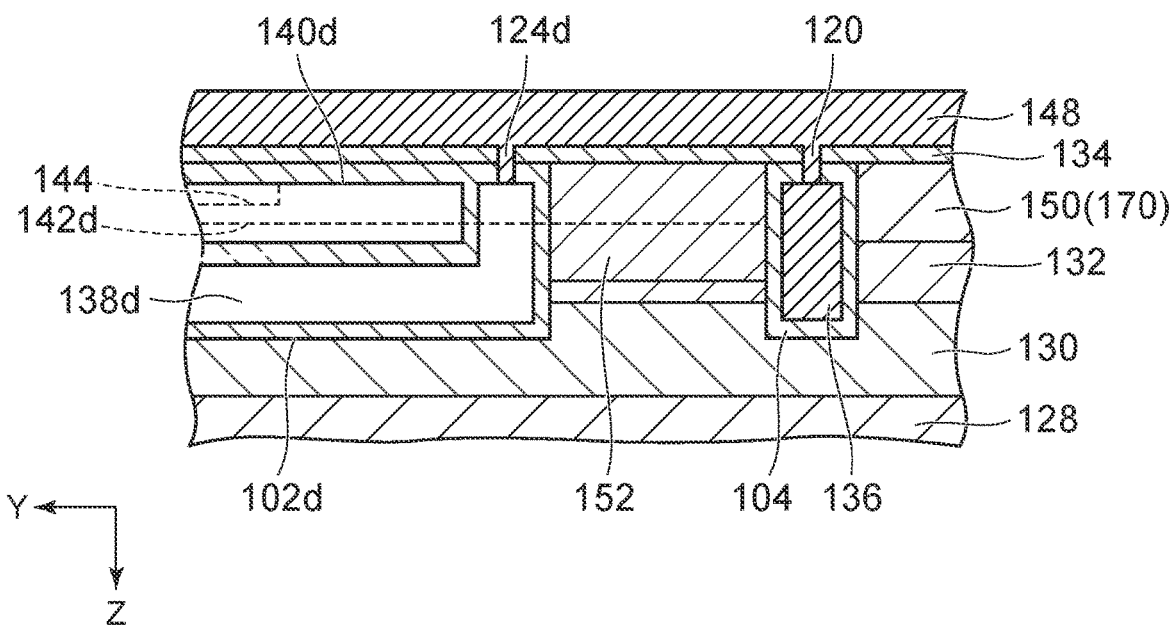
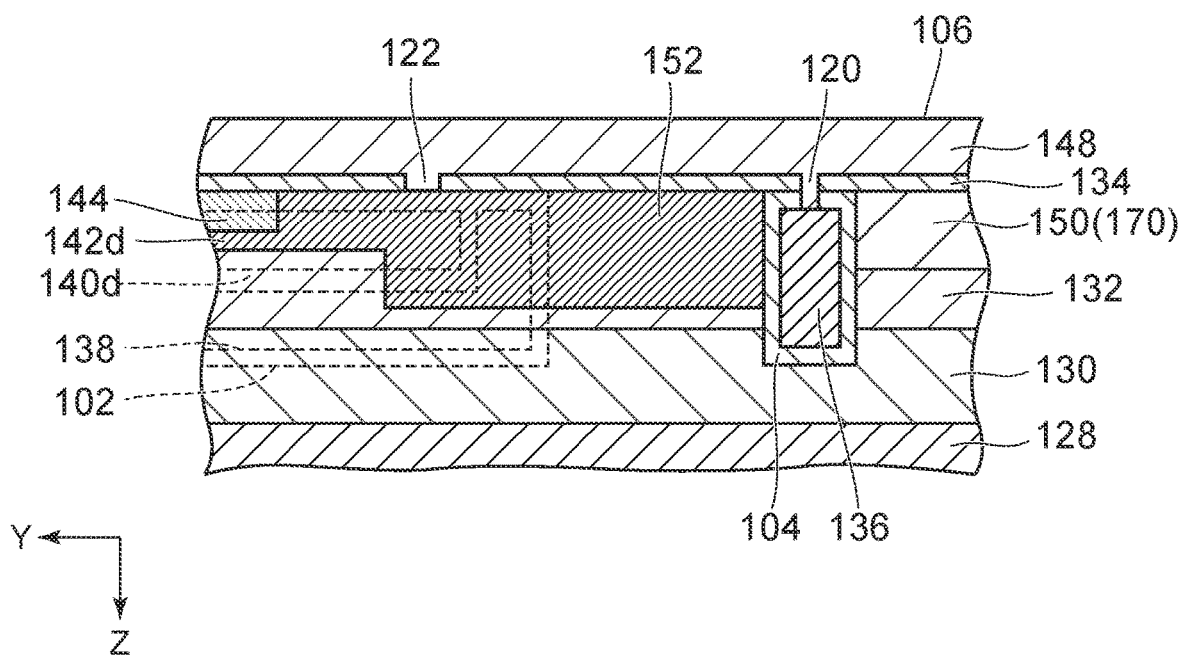

SEMICONDUCTOR DEVICE

BACKGROUND

The disclosure relates to a semiconductor device, and more particularly, to a power semiconductor for handling significant power levels, such as MOSFET (Metal Oxide Semiconductor Field Effect Transistor), and IGBT (Insulated Gate Bipolar Transistor).

A semiconductor device disclosed in U.S. Pat. No. 9,818,828 to West et al. ("West"), is provided with an active region and a terminal region provided so as to surround the active region as shown in FIG. 1. West further discloses a cross-sectional view of the active region as shown in FIG. 2A. In the active region in FIG. 2A, a MOSFET is disclosed which may include gate electrodes 118 provided in each of trenches 102 with an insulating film 112 interposed therebetween, a drain region 138 of a first conductivity type (n-type), drift regions (124, 126) of the first conductivity type (n-type), a base region 130 of a second conductivity type (p-type), a source region 128 of the first conductivity type (n-type), source electrodes 134, and drain electrodes not illustrated. In the MOSFET disclosed in West, the source region 128 and the base region 130 are electrically connected to the source electrodes 134. In the active region shown in FIG. 2A, the gate electrodes 118 are provided in a portion of the trenches 102 facing the base region 130 with the insulating film 112 interposed therebetween. West further discloses that a field plate electrode 116 may be arranged in each trench 102 with insulating films (112, 114) interposed therebetween. The field plate electrode 116 of West may be formed at a position deeper than the gate electrodes 118 and electrically connected to the source electrodes 134. The field plate electrode 116 may be arranged so as to penetrate through the gap between the left and right gate electrodes 118 as illustrated in FIG. 2A of West. West discloses that the impurity concentration in the second drift region 124 is higher than the impurity concentration in the first drift region 126, so that drift regions with multiple impurity concentrations are formed. In FIG. 2B of West, a cross-sectional view of the terminal region is illustrated in which the left side is the active region side while the right side is the chip end side. FIG. 2B of West shows that the base region 130 may be arranged in a mesa portion 106 on the left side of the left trench 104 of the two trenches 104. West further discloses that the base region 130 connected to the outermost source electrode portion is equal in depth to the base region 130 in the active region.

In U.S. Patent Application Publication No. 2009/0152624 to Hiller, et al. ("Hiller") a semiconductor device is disclosed in which a field plate electrode 8 is formed under a gate electrode 23. Hiller discloses that, in the terminal region in the semiconductor device illustrated in FIG. 4B, a base region 13 connected to the outermost source electrode portion is equal in depth to the base region 13 in the active region. A p-type region 12 shallower than the base region 13 is formed on an outer side of a trench 10.

SUMMARY

One or more embodiments of a semiconductor device may include: a first semiconductor region of a first conductivity type; a second semiconductor region of a second conductivity type on the first semiconductor region; a third semiconductor region of the first conductivity type on the second semiconductor region; trenches penetrating through the second semiconductor region and reaching the first semiconductor region, each of the trenches comprising: a gate electrode, and an insulating film insulating the gate electrode from the first semiconductor region and the second semiconductor region, an upper electrode electrically connected to the second semiconductor region and the third semiconductor region; a fourth semiconductor region of the second conductivity type arranged on an outer side of a trench that comprises an outermost gate electrode in a plan view; and an edge trench arranged on an outer side of the fourth semiconductor region. The fourth semiconductor region may be electrically connected to the upper electrode and a bottom of the fourth semiconductor may be arranged deeper than a bottom of the second semiconductor region.

In one or more alternative or additional embodiments a semiconductor device may include: a first semiconductor region of a first conductivity type; a second semiconductor region of a second conductivity type on the first semiconductor region; a third semiconductor region of the first conductivity type on the second semiconductor region; trenches penetrating through the second semiconductor region and reaching the first semiconductor region, each of the trenches comprising: a gate electrode, and an insulating film insulating the gate electrode from the first semiconductor region and the second semiconductor region, an upper electrode electrically connected to the second semiconductor region and the third semiconductor region; a fourth semiconductor region of the second conductivity type arranged on an outer side of a trench that comprises an outermost gate electrode in a plan view; an edge trench arranged on an outer side of the fourth semiconductor region; and a seventh semiconductor region of the first conductivity type whose impurity concentration is lower than an impurity concentration in the first semiconductor region at a same depth, the seventh semiconductor region being arranged in a region between the trench comprising the outermost gate electrode and the edge trench.

BRIEF DESCRIPTION OF DRAWINGS

FIG. 3 is a diagram illustrating a cross-sectional view along the line B-B' of FIG. 2;

FIG. 4 is a diagram illustrating a cross-sectional view along the line C-C' of FIG. 2;

FIG. 5 is a diagram illustrating a cross-sectional view along the line D-D' of FIG. 2;

DETAILED DESCRIPTION

Figure 1:
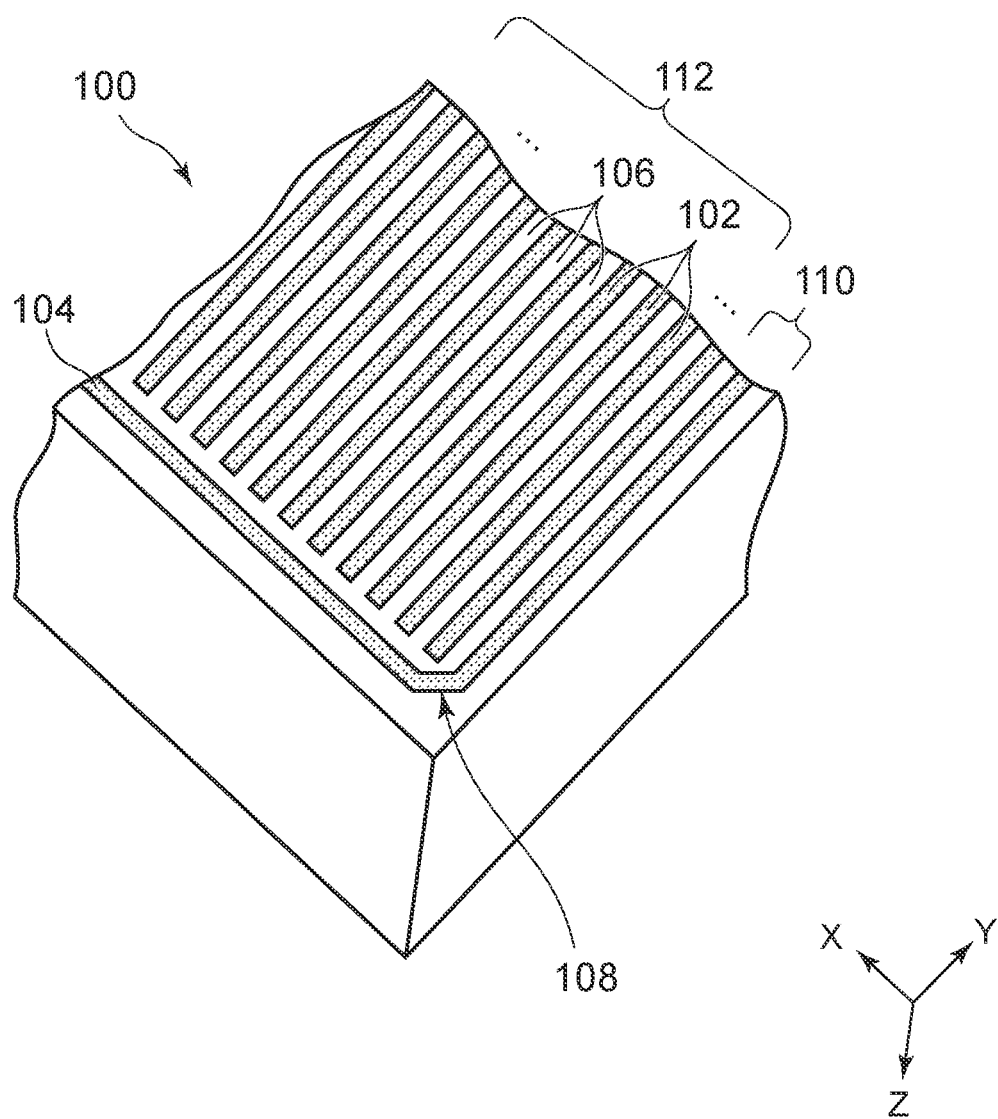
FIG. 1 is diagram illustrating a perspective view of a part of a semiconductor device according to one or more embodiments.

One or more embodiments are described in detail with reference to the drawings. In the following description of the drawings, identical or similar portions may be denoted by identical or similar reference numerals. The drawings are schematic in nature with the attendant description. Thus, the drawings my not be to scale and relations of thicknesses and dimensions, ratios of thicknesses of layers, and the like are mere examples and do not intend to limit the scope of the technical concepts of the invention and the dimensional relations or ratios may vary among the drawings.

Prepositions, such as "on", "over" and "above" may be defined with respect to a surface, for example a layer surface, regardless of that surface's orientation in space. The preposition "above" may be used in the specification and claims even if a layer is in contact with another layer. The preposition "on" may be used in the specification and claims when a layer is not in contact with another layer, for example, when there is an intervening layer between them. The term "electrically connected" may be used in the specification and claims when a layer or a region is not physically connected or is not physically in contact with another layer or a region.

The one or more embodiments may describe an example in which a first conductivity type is an n-type and a second conductivity type is a p-type. However, it is also possible in accordance with disclosed and recited embodiments that the examples may be implemented in a reverse relation of the conductivity types, e.g. where the first conductivity type is the p-type and the second conductivity type is the n-type. When positional relations among components are discussed in the following description, explanations including an "upper side", a "lower side", a "right side", a "left side", and so forth are used as appropriate based on directions in the drawings to be referred to. Nonetheless, these directions do not limit the technical ideas of the invention. Explanations including the "upper side", the "lower side", the "right side", the "left side", and so forth may be used even when relevant components are not in contact. An X axis, a Y axis, and a Z axis as shown in one or more of the illustrations may be used when explaining the directions. Mainly in a case of a cross-sectional view, a "lateral direction" or a "longitudinal direction" may represent an X direction an opposite direction to the X direction, an Y direction or an opposite direction to the Y direction in the embodiments illustrated in the drawings. A "depth direction" may represent a direction to a Z direction in describing the embodiments illustrated in the drawings; and a "height direction" may represent a direction opposed to the Z direction in the embodiments illustrated in the drawings.

FIG. 1 is a diagram illustrating a perspective view of part of a semiconductor device 100 according to one or more embodiments. The semiconductor device 100 includes a terminal region 110 and an active region 112. The terminal region 110 includes an edge trench 104 arranged around an outer peripheral portion of the active region 112. The semiconductor device 100 may include a single edge trench 104 as illustrated. However, the number of edge trenches 104 is not limited to one and the semiconductor device 100 may include 2, 3, 4, 5, 6, 7, 8, 9, 10 or more edge trenches 104. At each corner portion of the semiconductor device 100, the edge trench 104 may be shaped to include a bent corner portion 108, such that 90 degree corners may be avoided. The active region 112 includes trenches 102 and pillars 106. The trenches 102 may be arranged at predetermined intervals and the pillars 106 are arranged between the trenches 102. The trenches 102 and the pillars 106 are alternately arranged substantially in parallel with each other.

Figure 2:
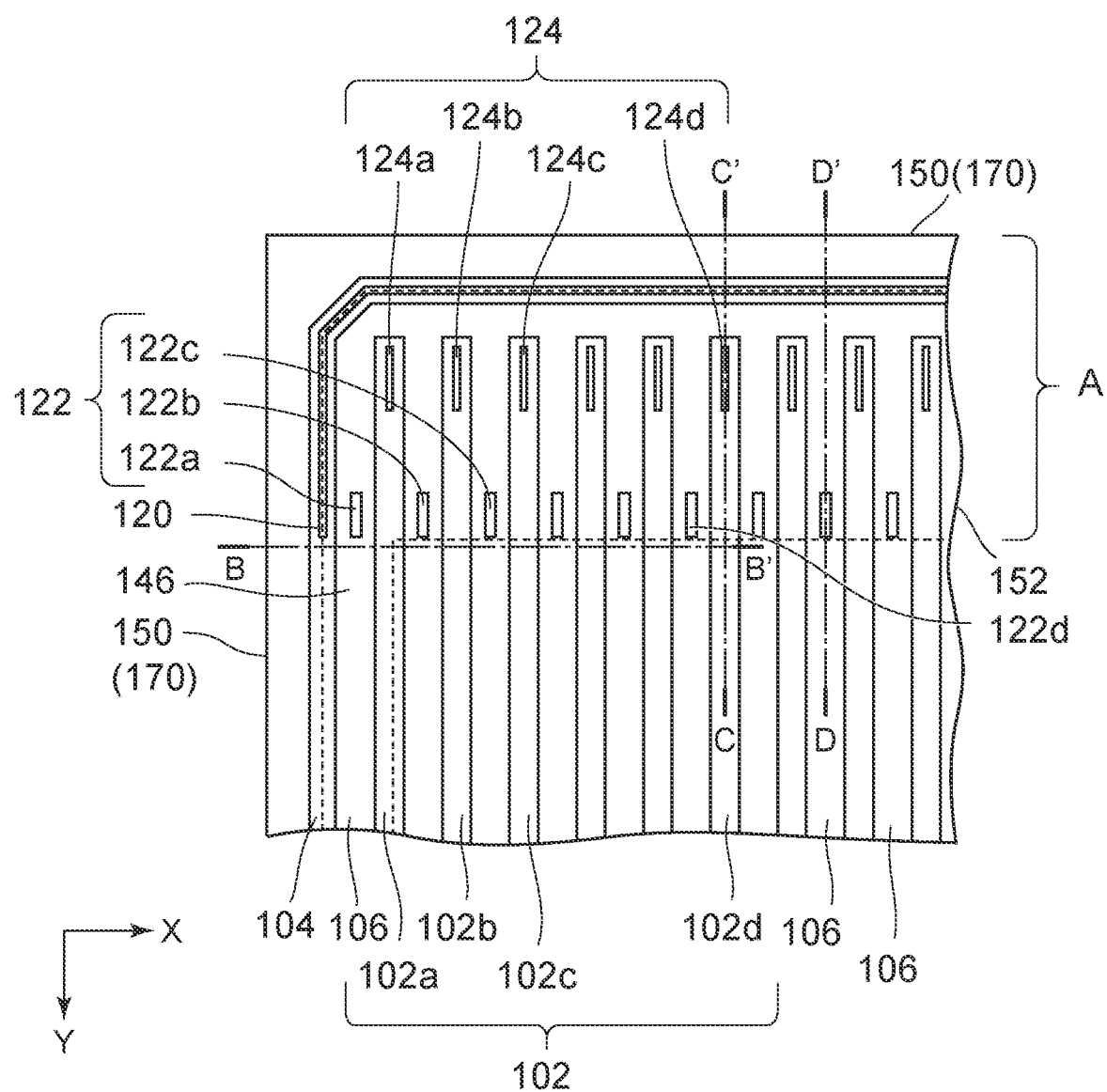
FIG. 2 is diagram illustrating a top view of a part of a semiconductor device according to one or more embodiments.

FIG. 2 is a diagram illustrating top view of a part of a semiconductor device according to one or more embodiments. An edge trench 104 is arranged near the outer periphery of this semiconductor device, and a terminal contact 120 is arranged in the edge trench 104. A trench group 102 including trenches 102a, 102b, and 102c is arranged on the inner side of the edge trench 104. The trenches 102a, 102b, and 102c are arranged at predetermined intervals in a direction (X direction) substantially perpendicular to a longitudinal direction (Y direction) in which the trenches extend. A first contact group 122 including first contacts 122a, 122b, 122c, and 122d may be arranged between the edge trench 104 and the trench 102a, and between the trenches in the trench group 102. For example, a first contact 122a is arranged between the edge trench 104 and the trench 102a; and a first contact 122b is arranged between the trench 102a and the trench 102b. A second contact group 124 including second contacts 124a, 124b, 124c, and 124d may be arranged near the longitudinal ends of the trench group 102. For example, second contacts 124a, 124b, 124c, and 124d are arranged near longitudinal ends of the trenches 102a, 102b, 102c, and 102d.

FIGS. 3, 4, and 5 are diagrams illustrating various cross-sectional views a semiconductor device as shown in FIG. 2 according to one or more embodiments. For example, FIG. 3 illustrates a cross-sectional view along the line B-B' of FIG. 2; FIG. 4 illustrates a cross-sectional view along the line C-C' of FIG. 2; and FIG. 5 illustrates a cross-sectional view along the line D-D' of FIG. 2.

In one or more embodiments, the semiconductor device illustrated in FIG. 3 includes a drain region 128, a first drift layer 130 arranged on the drain region 128, a second drift layer 132 arranged on the first drift layer 130, an insulating film 134 arranged on the second drift layer 132, and an upper electrode 148 arranged on the insulating film 134. The semiconductor device includes the terminal region 110 including the edge trench 104, and the active region 112. The edge trench 104 includes a second field electrode 136 disposed therein, and is electrically insulated from the first drift layer 130 and the second drift layer 132 by the insulating film 134 filled in the edge trench 104. The second field electrode 136 is electrically coupled to the upper electrode 148 by the terminal contact 120. The active region 112 includes the trenches 102a, 102b, 102c, and 102d in which the first field electrodes 138a, 138b, 138c, and 138d and gate electrodes 140a, 140b, 140c, and 140d may be positioned, respectively as illustrated. That is, the first field electrodes 138a, 138b, 138c, and 138d may be positioned relative to the gate electrodes 140a, 140b, 140c, and 140d in each of the respective trenches 102a, 102b, 102c, and 102d as illustrated such that at least portions of the first field electrodes 138a-138d are below the gate electrodes 140a-140d. The first field electrodes 138a, 138b, 138c, and 138d and the gate electrodes 140a, 140b, 140c, and 140d are electrically insulated from the first drift layer 130 and the second drift layer 132 by the insulating film 134 filled in the trenches 102a, 102b, 102c, and 102d. A base region 142a is arranged between the trench 102a and the trench 102b in the pillar 106. The base region 142a is electrically coupled to the upper electrode 148. Similarly, a base region 142b is arranged in the pillar 106 between the trench 102b and the trench 102c. A base region 142c is arranged in the pillar 106 on the side of the trench 102c in the X direction. A source region 144 is arranged on either side of the trench 102d. The source region 144 is arranged at a position on a base region 142d and under the insulating film 134 so as to face the gate electrode 140d. The source region 144 is electrically coupled to the upper electrode 148. The first drift layer 130 and the second drift layer 132 may be a first conductivity type semiconductor.

A semiconductor device as illustrated in FIG. 4, which depicts a cross-sectional view along the line C-C' of FIG. 2, includes the first drift layer 130 and the second drift layer 132. However, in alternative or additional embodiments, the first drift layer 130 and the second drift layer 132 may be a single drift region. The first drift layer 130 and the second drift layer 132 (or a single drift region) may also be referred to as a first semiconductor region 129. Each base region 142 may be a second conductivity type semiconductor and may be referred to as a second semiconductor region. The source region 144 may be a first conductivity type semiconductor and may be referred to as a third semiconductor region. The drain region 128 may be a first conductivity type semiconductor.

Referring back to FIG. 3, a fourth semiconductor region 146 of the second conductivity type illustrated in FIG. 3 is arranged in a semiconductor region sandwiched between the trench 102a, in which the outermost gate electrode 140a in a plan view is arranged, and the edge trench 104 positioned on the outer side of the trench 102a. The fourth semiconductor region 146 is electrically connected to the upper electrode 148. The bottom depth of the fourth semiconductor region 146 is such that it is formed to a position deeper than the bottom depth of each base region 142 of the second conductivity type.

When the semiconductor device is off, depletion layers are generated in a semiconductor region A illustrated in FIG. 2. By arranging the fourth semiconductor region 146 to extend to a position deeper than the bottom depth of the base region 142a, the position at which the depletion layer between the fourth semiconductor region 146 and a region including the first semiconductor region 129 contacting the fourth semiconductor region 146 begins expanding may be deeper. Thus, the arrangement of the fourth semiconductor region 146, including the increased depth thereof, ensures an adequate distance between each gate electrode 140 and the depletion layer and thereby improves the withstand voltage (also known as a breakdown voltage) at the terminal region 110 in the semiconductor device.

It will be appreciated that the depth of a semiconductor region represents the depth at a region around each trench 102 present in the semiconductor region or around a line extending from the trench 102. The depth of each gate electrode 140 represents the depth on the lateral side of the trench 102 in which the gate electrode 140 is present.

Thus, the bottom depth of the fourth semiconductor region 146 may be deeper than the bottom depth of the outermost gate electrode 140a, ensuring a sufficient distance from the outermost gate electrode 140a to the PN junction between the fourth semiconductor region 146 of the second conductivity type and the corresponding N-type layer. Accordingly, the withstand voltage at the terminal region 110 in the semiconductor device may be thereby improved.

The first drift layer 130 and the second drift layer 132 may be semiconductor regions of the first conductivity type, and the second drift layer 132 may include a portion higher in impurity concentration than the first drift layer 130. The fourth semiconductor region 146 may be of the second conductivity type and may be present at a position higher than the interface between the first drift layer 130 and the second drift layer 132. That is, the fourth semiconductor region 146 may extend, not to the interface between the first drift layer 130 and the second drift layer 132, but to a position before the interface in the direction opposite to the Z direction as illustrated in FIG. 3.

A fifth semiconductor region 150 of the second conductivity type may be formed on the outer side of the edge trench 104 in a plan view (the side in the direction opposite to the X direction in FIG. 3). The bottom depth of the fifth semiconductor region 150 may be such that it extends to a position deeper than the depth of each base region 142. By extending the fifth semiconductor region 150 to the deeper position on the outer side of the edge trench 104 in the plan view, it may prevent the lines of electric force in the semiconductor region portion (A) illustrated in FIG. 2 from being directed upward, and ensure a distance between each gate electrode 140 and the depletion layer. By preventing the upward direction of the electric force, the withstand voltage at the terminal region in the semiconductor device may be improved.

With reference again to FIG. 3, the first field electrode 138d is formed at a position in the trench 102d deeper than the gate electrode 140d (in the Z direction illustrated in FIG. 3), and the first field electrode 138d may be electrically connected to the upper electrode 148. Generally, in a semiconductor device with such a structure, the impurity concentration in the drift regions is sometimes raised in order to lower the on-resistance of the semiconductor device. However, raising the impurity concentration may narrow the expansion of the depletion layer toward the drift regions and thus make it difficult to ensure an acceptable withstand voltage at the terminal region in the semiconductor device. However, with the configurations described above in one or more embodiments, it becomes possible to provide a semiconductor device with a low on-resistance and high withstand voltage. It may be preferable that the withstand voltage is in the range between 20V (volt) to 600V, and it may be more preferable that the withstand voltage is in the range between 40V to 200V. It may be preferable that the high withstand voltage is more than 600V (volt), and it may be more preferable that the high withstand voltage is more than 200V.

The edge trench 104 may be formed so as be separated from the trenches 102 and surround the trenches 102 in a plan view. The second field electrode 136 is formed inside the edge trench 104 with the insulating film 134 interposed therebetween preventing the lines of electric force in the semiconductor region portion (A) illustrated in FIG. 2 from being directed upward, and ensuring a distance between each gate electrode 140 and the depletion layer. Hence, the withstand voltage at the terminal region 110 in semiconductor device can be improved.

As can be seen with reference to FIG. 5, in one or more embodiments, the base region 142 extends to the edge trench 104 and does not extend beyond the edge trench 104 to the outer side. However, configurations in accordance with other embodiments, are not so limited. In one or more alternative or additional embodiments, each base region may extend outward (the direction opposite to the Y direction in FIG. 5) beyond the edge trench 104.

With reference to FIG. 2, a sixth semiconductor region 152 is formed on an end side of each trench 102 on the inner side (in the X direction in FIG. 2) of the edge trench 104. The sixth semiconductor region 152 may be connected to the fourth semiconductor region 146. The fourth semiconductor region 146 and the sixth semiconductor region 152 may surround the trench group 102 as illustrated by the dotted line in FIG. 2. The bottom of the sixth semiconductor region 152 is deeper than the bottom of each base region 142. By providing the sixth semiconductor region 152 deeply on the end side of each trench 102, a sufficient distance form the end of the gate electrode 140 to the PN junction between the sixth semiconductor region 152 and the first semiconductor region 129 may be ensured and the withstand voltage at the terminal region 110 in the semiconductor device may be improved. The surface of the sixth semiconductor region 152 sandwiched between, for example, the trench 102a and the edge trench 104 in a plan view is electrically connected to the upper electrode 148 from the trench 102a by the first contact 122a on the active region 112 side (the side in the X direction illustrated in FIG. 2). The first field electrode 138a in the trench 102a is extended upward from an opening portion of the trench 102a on the end side (in the direction opposite to the Y direction in FIG. 2) of the trench 102a and is connected to the upper electrode 148 by the second contact 124a. By arranging and connecting the field electrode 138a in the above described manner, the distance of leakage current flowing through the terminal region 110 may be shortened and an efficient flow of current to the upper electrode 148 may be enabled. The structure of the gate electrodes 140d in the trench group 102 may be such that the gate electrodes 140d are present only on the active region 112 side relative to the ends of the first field electrodes 138d (see FIG. 4). The illustrated configuration can raise the withstand voltage at the terminal region 110.

The above description involves an example embodiment or embodiments in which the fourth semiconductor region of the second conductivity type is provided in the semiconductor device. However, in alternative or additional embodiments, in the region outside of the edge trench 104, a seventh semiconductor region 170 of the first conductivity type may be provided whose impurity concentration is lower than the impurity concentration in the first semiconductor region 129 at the same depth. For example, the seventh semiconductor region 170 may be arranged at the position of semiconductor region 150 in FIG. 3. By providing the seventh semiconductor region 170, the withstand voltage at the terminal region 110 can be raised, as in the case of providing the fourth semiconductor region 146 of the second conductivity type. It may be preferable that the withstand voltage is in the range between 20V (volt) and 600V, and it may be more preferable that the withstand voltage is in the range between 40V and 200V. It may be preferable that the high withstand voltage is more than 600V (volt), and it may be more preferable that the high withstand voltage is more than 200V.

Figure 6:
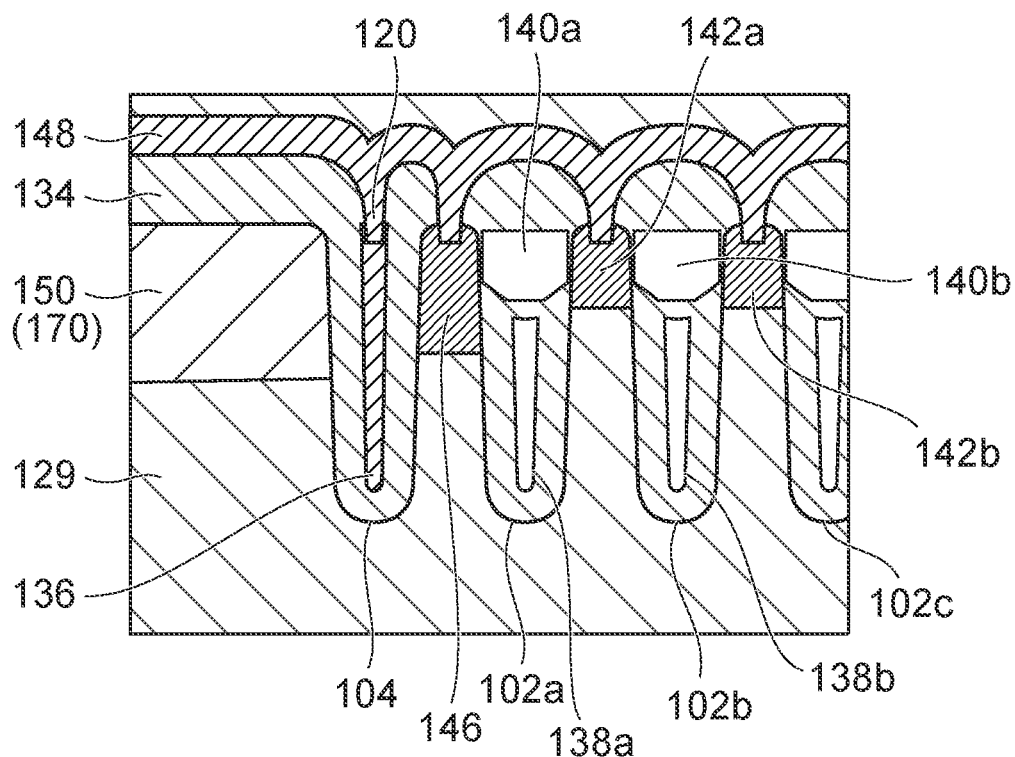
FIG. 6 is a diagram illustrating a cross-sectional view of a semiconductor device according to one or more embodiments.

FIG. 6 is a cross-sectional view illustrating a semiconductor device according to one or more embodiments. The semiconductor device illustrated in FIG. 6 includes a first semiconductor region 129, an insulating film 134, and an upper electrode 148, and an edge trench 104 and trenches 102a and 102b are formed in the first semiconductor region 129.

The trenches 102a and 102b include gate electrodes 140a and 140b therein as well as the first field electrodes 138a and 138b, respectively Base regions 142a and 142b are arranged between the trench 102a and the trench 102b and between the trench 102b and a trench 102c, respectively. The base regions 142a and 142b are electrically coupled to the upper electrode 148.

A fourth semiconductor region 146 of the second conductivity type is formed in a semiconductor region sandwiched between the trench 102a, in which the outermost gate electrode 140a is arranged, and the edge trench 104 positioned on the outer side of the trench 102a. The fourth semiconductor region 146 is electrically connected to the upper electrode 148. The bottom depth of the fourth semiconductor region 146 is such that it is arranged to a position deeper than the bottom depth of each base region 142 of the second conductivity type.

A fifth semiconductor region 150 of the second conductivity type is formed on the outer side of the edge trench 104. The bottom depth of the fifth semiconductor region 150 may be advantageously set such that it extends to a position deeper than the bottom depth of the fourth semiconductor region 146. By extending the fifth semiconductor region 150 to the deeper position on the outer side of the edge trench 104, the lines of electric force in the semiconductor region portion (A) illustrated in FIG. 2 may be prevented from being directed upward, which ensure a distance between each gate electrode 140 and the depletion layer. Such a configuration may improve the withstand voltage at the terminal region in the semiconductor device.

Figure 7:
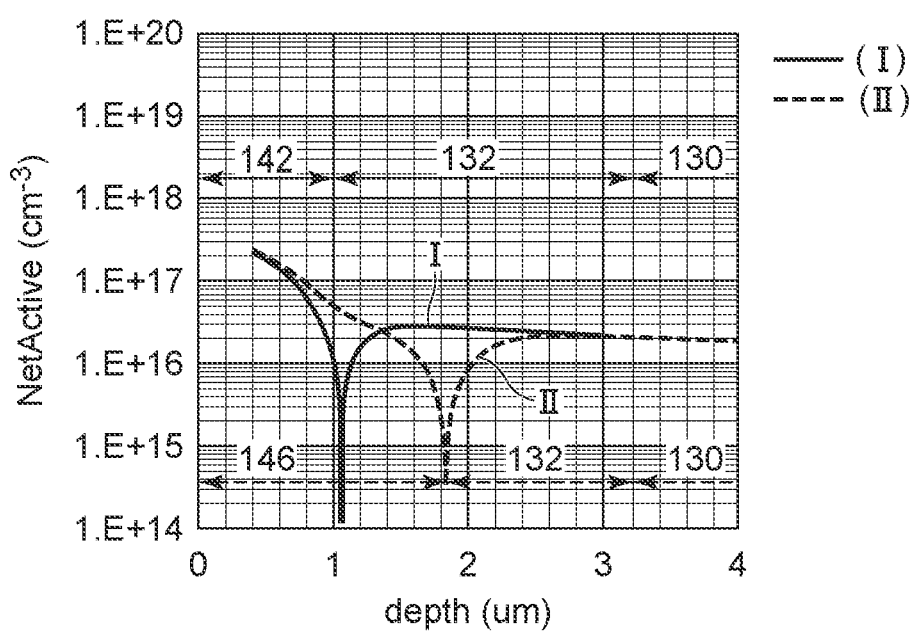
FIG. 7 is a diagram illustrating the impurity concentration along a depth direction of a semiconductor device, such as is illustrated in FIG. 3.

FIG. 7 is a graph illustrating the impurity concentration along the depth direction in FIG. 3 (the Z direction in FIG. 3). The line (I) illustrates the impurity concentration in the base region 142a, the second drift layer 132, and the first drift layer 130 in FIG. 3 in this order along the depth direction (the Z direction in FIG. 3). The line (I) schematically illustrates the depth positions of the base region 142a, the second drift layer 132, and the first drift layer 130 with their reference signs. The dashed line (II) illustrates the impurity concentration in the fourth semiconductor region 146, the second drift layer 132, and the first drift layer 130 in this order along the depth direction. The dashed line (II) schematically illustrates the depth positions of the fourth semiconductor region 146, the second drift layer 132, and the first drift layer 130 with their reference signs.

Although one or more embodiments of the invention have been described above, it is to be understood that the discussions and drawings constituting part of this disclosure do not intend to limit the scope of this invention. It is obvious to a person skilled in the art to reach various alternative embodiments, examples, and operation technologies from the teaching of this disclosure. In this context, this invention will naturally encompass various other embodiments and so forth which are not expressly disclosed herein. Therefore, the technical scope of this invention is to be determined solely in consideration of the subject matters as defined in the appended claims that are deemed appropriate from the above description. This invention is applicable to a power semiconductor device in particular.

The invention claimed is:

1. A semiconductor device comprising:
   a first semiconductor region of a first conductivity type;
   a second semiconductor region of a second conductivity type on the first semiconductor region;
   a third semiconductor region of the first conductivity type on the second semiconductor region;
   trenches penetrating through the second semiconductor region and reaching the first semiconductor region, each of the trenches comprising:
      a gate electrode; and
      an insulating film insulating the gate electrode from the first semiconductor region and the second semiconductor region;
   an upper electrode electrically connected to the second semiconductor region and the third semiconductor region;
   a fourth semiconductor region of the second conductivity type arranged on an outer side of a trench that comprises an outermost gate electrode in a plan view; and
   an edge trench arranged on an outer side of the fourth semiconductor region, wherein
   the fourth semiconductor region is electrically connected to the upper electrode and a bottom of the fourth semiconductor is arranged deeper than a bottom of the second semiconductor region,
   the first semiconductor region comprises:
      a first region; and
      a second region that is positioned on the first region and has a higher in impurity concentration than the first region, a fifth semiconductor region of the second conductivity type is positioned on an outer side of the edge trench in a plan view, and
a bottom of the fifth semiconductor region is arranged deeper than the bottom of the second semiconductor region.

2. The semiconductor device according to claim 1, wherein the bottom of the fourth semiconductor region is arranged deeper than a bottom of the outermost gate electrode of the trench.

3. The semiconductor device according to claim 1, wherein the bottom of the fourth semiconductor region is positioned higher than a bottom of the second region.

4. The semiconductor device according to claim 1, wherein the bottom of the fourth semiconductor region is arranged shallower than an interface between the second region and the first region.

5. The semiconductor device according to claim 1, further comprising a first field electrode arranged inside each of the trenches at a position under the gate electrode thereof,
wherein the first field electrode is electrically connected to the upper electrode.

6. The semiconductor device according to claim 1, wherein
the edge trench is arranged so as to be separated from the trenches and surround the trenches in a plan view, and
the edge trench comprises:
a field electrode; and
an insulating film insulating the field electrode from the first semiconductor region and the second semiconductor region.

7. A semiconductor device comprising:
a first semiconductor region of a first conductivity type;
a second semiconductor region of a second conductivity type on the first semiconductor region;
a third semiconductor region of the first conductivity type on the second semiconductor region;
trenches penetrating through the second semiconductor region and reaching the first semiconductor region, each of the trenches comprising:
a gate electrode; and
an insulating film insulating the gate electrode from the first semiconductor region and the second semiconductor region;
an upper electrode electrically connected to the second semiconductor region and the third semiconductor region;
a fourth semiconductor region of the second conductivity type arranged on an outer side of a trench that comprises an outermost gate electrode in a plan view;
an edge trench arranged on an outer side of the fourth semiconductor region;
a fifth semiconductor region of the second conductivity type positioned on an outer side of the edge trench in a plan view;
a sixth semiconductor region of the second conductivity type electrically connected to the fourth semiconductor region on an end side of the trenches located on an inner side of the edge trench in a plan view, wherein
the fourth semiconductor region is electrically connected to the upper electrode and a bottom of the fourth semiconductor is arranged deeper than a bottom of the second semiconductor region,
the first semiconductor region comprises:
a first region; and
a second region that is positioned on the first region and has a higher in impurity concentration than the first region,
the edge trench is arranged so as to be separated from the trenches and surround the trenches in a plan view,
the edge trench comprises:
a field electrode; and
an insulating film insulating the field electrode from the first semiconductor region and the second semiconductor region,
a bottom of the fifth semiconductor region is arranged deeper than the bottom of the second semiconductor region, and
a bottom of the sixth semiconductor region is arranged at a position deeper than the bottom of the second semiconductor region.

8. The semiconductor device according to claim 7, wherein the bottom of the fourth semiconductor region is arranged deeper than a bottom of the outermost gate electrode of the trench.

9. The semiconductor device according to claim 8, wherein the bottom of the fourth semiconductor region is positioned higher than a bottom of the second region.

10. The semiconductor device according to claim 8, wherein the bottom of the fourth semiconductor region is arranged shallower than an interface between the second region and the first region.

11. The semiconductor device according to claim 7, further comprising a first field electrode arranged inside each of the trenches at a position under the gate electrode thereof,
wherein the first field electrode is electrically connected to the upper electrode.

12. A semiconductor device comprising:
a first semiconductor region of a first conductivity type;
a second semiconductor region of a second conductivity type on the first semiconductor region;
a third semiconductor region of the first conductivity type on the second semiconductor region;
trenches penetrating through the second semiconductor region and reaching the first semiconductor region, each of the trenches comprising:
a gate electrode, and
an insulating film insulating the gate electrode from the first semiconductor region and the second semiconductor region,
an upper electrode electrically connected to the second semiconductor region and the third semiconductor region;
a fourth semiconductor region of the second conductivity type arranged on an outer side of a trench that comprises an outermost gate electrode in a plan view;
an edge trench arranged on an outer side of the fourth semiconductor region; and
a seventh semiconductor region of the first conductivity type whose impurity concentration is lower than an impurity concentration in the first semiconductor region at a same depth, the seventh semiconductor region being arranged in a region between the trench comprising the outermost gate electrode and the edge trench.

13. The semiconductor device according to claim 12, wherein the bottom of the fourth semiconductor region is arranged deeper than a bottom of the outermost gate electrode of the trench.

14. The semiconductor device according to claim 13, wherein the first semiconductor region comprises:
a first region; and a second region that is positioned on the first region and has a higher in impurity concentration than the first region.

15. The semiconductor device according to claim 14, wherein the bottom of the fourth semiconductor region is positioned higher than a bottom of the second region.

16. The semiconductor device according to claim 14, wherein the bottom of the fourth semiconductor region is arranged shallower than an interface between the second region and the first region.

17. The semiconductor device according to claim 12, further comprising a first field electrode arranged inside each of the trenches at a position under the gate electrode thereof, wherein
the first field electrode is electrically connected to the upper electrode.

18. The semiconductor device according to claim 17, wherein
the edge trench is arranged so as to be separated from the trenches and surround the trenches in a plan view, and
the edge trench comprises:
a field electrode; and
an insulating film insulating the field electrode from the first semiconductor region and the second semiconductor region.

19. The semiconductor device according to claim 18, further comprising a sixth semiconductor region of the second conductivity type electrically connected to the fourth semiconductor region on an end side of the trenches located on an inner side of the edge trench in a plan view, wherein
a bottom of the sixth semiconductor region is arranged at a position deeper than the bottom of the second semiconductor region.

20. A semiconductor device comprising:
a first semiconductor region of a first conductivity type;
a second semiconductor region of a second conductivity type on the first semiconductor region;
a third semiconductor region of the first conductivity type on the second semiconductor region;
trenches penetrating through the second semiconductor region and reaching the first semiconductor region, each of the trenches comprising:
a gate electrode; and
an insulating film insulating the gate electrode from the first semiconductor region and the second semiconductor region;
an upper electrode electrically connected to the second semiconductor region and the third semiconductor region;
a fourth semiconductor region of the second conductivity type electrically connected on an end side of the trenches;
an edge trench arranged on an outer side of the fourth semiconductor region; wherein
the fourth semiconductor region of the second conductivity type is electrically connected on the end side of the trenches located on an inner side of the edge trench in a plan view,
the first semiconductor region comprises:
a first region; and
a second region that is positioned on the first region and has a higher in impurity concentration than the first region,
the edge trench is arranged so as to be separated from the trenches and surround the trenches in a plan view,
the edge trench comprises:
a field electrode having; and
an insulating film insulating the field electrode from the first semiconductor region and the second semiconductor region,
a bottom of the fourth semiconductor region is arranged at a position deeper than the bottom of the second semiconductor region, and
the fourth semiconductor region extends in a longitudinal cross-sectional direction from away from the edge of the edge trench to an active region side beyond the edge of the gate electrode.

\* \* \* \* \*